United States Patent [19]

Okazaki

[11] Patent Number: 4,707,311
[45] Date of Patent: Nov. 17, 1987

[54] METHOD OF MANUFACTURING SILICA-FREE INTERCONNECTED POROUS CERAMICS

[75] Inventor: Kiyoshi Okazaki, Yokohama, Japan

[73] Assignee: Mitsubishi Mining & Cement Co., Ltd., Tokyo, Japan

[21] Appl. No.: 639,954

[22] Filed: Aug. 10, 1984

Related U.S. Application Data

[63] Continuation-in-part of Ser. No. 215,544, Dec. 11, 1980.

[30] Foreign Application Priority Data

Dec. 26, 1979 [JP] Japan ............................ 54-170133
Sep. 16, 1980 [JP] Japan ............................ 55-128429

[51] Int. Cl.$^4$ .............................................. B28B 1/50
[52] U.S. Cl. .................................. 264/43; 264/44; 264/56; 264/DIG. 13; 264/DIG. 5
[58] Field of Search ............ 264/43, 44, 56, DIG. 13, 264/DIG. 5

[56] References Cited

U.S. PATENT DOCUMENTS

| | | | |
|---|---|---|---|
| 4,071,369 | 1/1978 | Kurz ........................................... | 264/43 |
| 4,233,256 | 11/1980 | Ohnsorg ...................................... | 264/44 |
| 4,244,898 | 1/1981 | Bandyopadhyay et al. .......... | 264/43 |
| 4,407,967 | 10/1983 | Luks ............................................ | 264/43 X |

Primary Examiner—Philip Anderson
Attorney, Agent, or Firm—Murray Schaffer

[57] ABSTRACT

In a method of manufacturing silica-free, interconnected porous ceramics, use is made of ceramic material powder which exhibits an expansion phenomenon due to reaction when fired; the ceramic material powder is mixed with binder; the mixture is molded; thereafter the molded mixture is fired and, during the firing process, held for a predetermined period of time at a predetermined temperature which is not lower than a temperature at which maximum expansion occurs in the expansion phenomenon but lower than a temperature at which the firing of the molded mixture is completed; and the firing process is stopped after a lapse of the predetermined period of time.

8 Claims, 14 Drawing Figures

20μm

100 μm

METHOD OF MANUFACTURING SILICA-FREE INTERCONNECTED POROUS CERAMICS

BACKGROUND OF THE INVENTION

This applicaton is a Continuation-in-Part of earlier application Ser. No. 215,544 filed Dec. 11, 1980.

1. Field of the Invention

This invention relates to a process of manufacturing silica-free, porous ceramics. More particularly, the present invention is directed to a process of fabricating porous ceramics with an enhanced porosity, a uniform pore distribution and controlled in terms of pore size, pore distribution and pore connectivity, and/or a porous ceramics body with an improved three-dimensional connectivity between the pores, and the ceramics per se.

2. Description of the Prior Art

There have heretofore been proposed various processes of producing a porous ceramics body.

One simple method may comprise the steps of mixing slurry material powder and air, molding the resultant mixture, and then sintering the molded mixture. In the method, an additive adapted to promote formation of a porous structure may also be added to the mixture; with such a method, when the mixture is heated and/or as a result of chemical reaction, the additive is caused to produce a gas which in turn causes formation of pores. U.S. Pat. No. 4,071,369 issued to Kurtz et al. discloses a similar method wherein clay is employed. Another similar method is the conventional method of producing foamed concrete wherein aluminum powder is added which reacts with an alkali solution to produce hydrogen gas.

In the case of electronic ceramics, however, use of clay is disadvantageous in that silica remains as a nonvolatile component which tends to have adverse effect on the electrical properties of the electronic ceramics.

U.S. Pat. No. 4,330,593 issued to Shrout et al. discloses a method of producing a porous structure by adding spherical particles of PMM to a commercially available PZT material, wherein the added particles, when heated, are decomposed and evaporated or fired into gas. In such a method, however, it is required that several 10 volume % of organic substance or PMM be added to produce a porous structure with a porosity in excess of 50%. As will readily be appreciated, that method is disadvantageous in that a molded body is subject to remarkable deformation when fired and crack is liable to occur in resulting ceramics. Another disadvantage is such that due to the fact that a large quantity of organic substance such as PMM must be evaporated, decomposed or fired during the sintering step, a long time is taken for decomposing the organic substance and a gassing step is involved. Without the steps of evaporating, decomposing or firing the organic substance and the gassing step, the interior portion of the sintered PZT ceramics body would remain reduced; thus, the body would fail to exhibit the piezoelectric property that PZT should have.

A further disadvantage of the method disclosed by Shrout et al. is such that since pores are formed at the positions where the PMM particles used to exist and yet the ceramics portion is densely solid, it often happens that no communication passage is established among the pores so that the latters tend to be isolated from each other and thus there is no passage that permits of escape of the gas resulting from the decomposing of the PMM so that during the sintering step, crack tends to be caused to occur in the resultant ceramics body due to the pressure of the gas expanded by heating.

Furthermore, difficulty is experienced in an attempt to achieve a desired porosity, due to the high shrinkage of the ceramics as fired and the liability to crack occurrence. Still furthermore, with the porous structure resulting from the method of Shrout et al. wherein the entire pores are hardly communicated with each other with a high connectivity, difficulty is encountered when it is attempted to fully impregnate the pores with silicon rubber or epoxy resin. Obviously, if the pores of the ceramics are not fully filled with the impregnated resin, then the resultant composite will exhibit a low flexibility and an unsatisfactory mechanical strength.

U.S. Pat. No. 4,227,111 issued to Skinner et al. discloses a method using coral replica. As will readily be appreciated, however, such a method is not compatible with industrial technology and yet by that method it is impossible to control pore structure such as porosity, pore size, pore distribution, pore connectivity and so forth.

A method of making ceramics of a ladder structure has also been proposed which may be compatible with industrial technology. Ceramics of a ladder structure comprises strip-like or rod-like ceramics elements which are three-dimensionally assembled together, and has a high connectivity. However, such a structure is disadvantageous in that the range of controllable pore size is limited. More specifically, with such a structure, it is difficult to form pores as small as 100 um or less, for example, and it is also difficult to control the porosity thereof. Moreover, the method forming a ladder structure involves troublesome steps.

As pointed out by Shrout et al., their method is considered more compatible with industrial technology than the method of Skinner et al. However, ceramics resulting from the method of Shrout et al. is inferior to ceramics having a ladder structure in terms of unformity of pore distribution, pore connectivity, etc.

SUMMARY OF THE INVENTION

The inventor has found out that an expansion phenomenon, which may be referred to as anomalous expansion phenomemon, occurs in a molded ceramics body or powder ceramics body in the course of firing thereof, possibly due to reaction between the constituents thereof, wherein the molded ceramics body or powder ceramics body either consists of a plurality of, non-fired or fired, powder materials selected from the group of compounds such as lead zirconate titanate, lead titanate, lead zirconate, $PbTa_2O_6$, $Pb_2Fe_2O_5$, $Pb(Ta_{0.5}Fe_{0.5})O_3$, $ZnFe_2O_3$ or has a composition containing one or more of such compounds. Referring to FIG. 1 of the accompanying drawings, it will be seen that some materials exhibit such an anomalous expansion phenomenon and thereafter contract until sintering is completed as shown by way of example by curves 3 to 6 while other materials simply contract without exhibiting such expansion phenomenon as shown by way of example by curves 7 to 9. It is to be understood that the inventor's finding constitutes the basis for the present invention.

Anomalous expansion results in pores being formed in the sintered body so that the latter's bulk density becomes lower. In the case of a system which represents an anomalous expansion phenomenon, if a body of particles having substantially uniform particle size is sintered in an attempt to achieve a structure of a good connectivity, then the size of pores formed in the sintered body can be controlled, but difficulties are encountered in increasing the porosity thereof. In other words, such body, when fired, is simply caused to contract, thus resulting in a higher bulk density than the initial value. If it is attempted to achieve a structure having a comparable quantity of pores with that of a system exhibiting an anomalous expansion phenomenon by using a material or materials exhibiting no anomalous expansion phenomenon and adding a binder or an organic substance thereto, then the result will be such that the structure possesses a poor connectivity. In contrast thereto, with a structure comprising a material or materials exhibiting an anomalous expansion phenomenon, it is possible to control the porosity thereof by virtue of the fact that the anomalous expansion phenomenon per se results in formation of pores. Furthermore, by using a substantially uniform particle size, it is also possible to control the size of pores. In this way, a very good connectivity can be achieved.

The curves 3 to 9 of FIG. 1 may be exemplified as corresponding to the following expressions (3) to (9) respectively:

$$PbO + TiO_2 \rightarrow PbTiO_3 \quad (3)$$

$$PbO + ZrO_2 \rightarrow PbZrO_3 \quad (4)$$

$$ZnO + Fe_2O_3 \rightarrow ZnFe_2O_4 \quad (5)$$

$$PbO + 0.55ZrO_2 + 0.45TiO_2 \rightarrow Pb(Zr_{0.55}T_{0.45})O_3 \quad (6)$$

$$(\text{or } 4PbO + Ta_2O_3 + Fe_2O_3 \rightarrow 4Pb(Ta_{0.5}Fe_{0.5})O_3)$$

$$(\text{or } 0.92BaCO_3 + 0.08CaCO_3 + TiO_2 \rightarrow (Ba_{0.92} + Ca_{0.08})TiO_3 + CO_2)$$

$$Bi_2O_3 + 3ZrO_2 \rightarrow Bi_2(ZrO_2)_3 \quad (7)$$

$$CuO + Fe_2O_3 \rightarrow CuFe_2O_4 \quad (8)$$

$$TiO_2 \text{ powder} \quad (9)$$

(or calcined $BaTiO_3$ powder)

Briefly stated, according to the present invention, in view of the result of the inventor's researches that in the aforementioned anomalous expansion phenomenon, the reaction has substantially been completed when a temperature $T_m$ at which maximum expansion occur as shown in FIG. 2A is reached, the following steps are taken: Powdered materials are mixed; binder is added to the mixture; and the latter is held, for a predetermined period of time such as indicated by $t_1$, $t_2$, $t_3$ and so on in FIG. 2B, at a temperature such as indicated by $T_1$, $T_2$, $T_3$ and so on in FIG. 2A which is not lower than the temperature $T_m$ at which maximum expansion occurs but lower than a temperature at which sintering completed, whereby desired interconnected porous ceramics is produced. It is considered that at the temperature $T_m$ at which maximum expansion occurs, the size of pores and porosity of the ceramics become the greatest of all that occur during the sintering process thereof, and that the sintering process has substantially been completed when such temperature is reached. Thus, the resultant ceramics can be used as intended porous body.

By utilizing such phenomenon, and by fully making use of ceramics technology, it has been confirmed that it is possible to produce ceramics of an enhanced porosity and a structure controlled in terms of pores and so forth, without adding any other additive than the constituents of the ceramics. The method of manufacturing ceramics according to the present invention is based on such confirmation.

Accordingly, an object of the present invention is to provide a method of manufacturing, without adding any pore-forming substance such as PMM or the like, a porous ceramics body wherein the pores are three-dimensionally connected together and the ceramics portions are also three-dimensionally connected together, the method being capable of achieving a high porosity, say 40% or higher, uniform and narrow distribution of pore size, and controlled pore size.

The method according to the present invention is advantageous over the conventional methods of manufacturing porous ceramics, among other things, in the following four points:

(1) The method of the present invention makes it possible to produce a ceramics body of a high porosity without using any pore-forming substance for the purpose of achieving a porous structure. The porosity should desirably be up to 99.9% maximum, but from the standpoint of strength limitation, it should be up to 70% maximum. The expression "pore-forming material" used herein refers to spherical particles of PMM employed in the aforementioned U.S. patent to Shrout et al, coral replica used in the foregoing U.S. patent to Skinner et al. or the like. In the method of the present invention, when a pore-forming material is employed, a simplified procedure permits of escape out of the cermaics body of the pore-forming material; this constitutes an important advantage from an industrial point of view. It is particularly to be noted that this feature results from the fact that the main principle for forming a porous structure in the method of the present invention is based on volume expansion of the ceramics materials resulting from reaction thereof. Thus, the method of this invention makes it possible to produce a porous ceramics body having contained therein no other chemical constituent than those to constitute the final product. As will be appreciated, the method of this invention turns out most suitable in an attempt to produce electronic ceramics containing a magnetic material.

(2) According to the method of the present invention, even when a pore-forming material such as spherical particles of high polymer is used, the amount of such a material to be used can be reduced, as a synergistic effect, in proportion to the extent of expansion of the ceramics body which occurs when the latter is fired. Obviously, this is meritorious as viewed from the standpoint of economy. Furthermore, the quantity of gas resulting from evaporation of the poreforming material is correspondingly decreased; thus, it is relatively easier to let the gas escape out of the porous ceramics body than in the method proposed by Shrout et al.

(3) The method of this invention makes it possible to control the pore size of a porous ceramics body of a high porosity. Pore size can be controlled by suitably selecting the particle size of the ceramics material to be used, firing temperature, and firing time. Pore size is controlled desirably in the range of 0.01 μm to 500 μm; from the standpoint of ease in production, it may be controlled in the range of 0.5 μm to 250 μm. Not only pore size but also pore size distribution can be controlled while a ceramics body of a high porosity is being made. By selecting the particle size of the ceramics material in use to be in a narrow band of distribution, the band of the pore distribution in the resultant fired ceramic body can also be made narrow.

(4) The method of the present invention provides a low apparent coefficent of contraction when a molded body of non-fired ceramics material is sintered, thus decreasing the possibility that cracking is caused to occur in the ceramics body.

Ceramics produced by the method of the present invention has the following characteristics:

(1) The ceramics is of a high porosity, say 70% maximum, and controlled in terms of pore size and pore distribution thereof. Thus, it can most effectively be applied in the field of a filter medium or the like, for example.

(2) The ceramics is of an improved three-dimensional connectivity of pores, with a closed-pore distribution as low as 50% or less; under a desirable condition, 20% or less.

(3) The ceramics is of an improved three-dimensional connectivity of ceramics portions. The improvement is especially remarkable when no pore-forming material is employed in the present method.

This results from the fact that the particles of non-fired ceramics material are in close contact with each other. The material particles are placed out of contact with each other when a pore-forming material is added. In the case of a piezoelectric material, for example, such improved connectivities result in an improved polarization effect since when the material is to be polarized, an electric field can be uniformly and sufficiently applied.

As will be appreciated from the above discussion, that according to the present invention, it is possible to produce ceramics with a desired porosity and pore size by controlling the sintering temperature and time. The porosity and pore size are also variable depending on the quantity of binder added and particle size thereof respectively. In the present invention, binder is added for two purposes. One of the purposes is to maintain the desired shape and mechanical strength of molded body. As binder for such purpose, use may be made of polyvinyl alcohol, methyl cellulose, paraffin, polyacrylic resin or the like. The other purpose is to promote formation of pores. Sintered porous ceramic body can be obtained by mixing a substance (an organic substance, for example) which can be decomposed, evaporated or flown out by applying heat thereto, with a non-sintered material mixture calcined and then pulverized, and granulating, molding and then sintering the mixture. Such an organic substance, which may be called pore forming agent, may consist of a constituent or constituents such as polyvinyl alcohol, polyacrylic resin or the like which when fired, is transformed into gas such as $CO_2$ and/or $H_2O$, $N_2$ or the like which is easily permitted to emerge out of the ceramic body. By controlling the particle size and quantity of the organic substance to be added, it is possible to control the size and quantity of pores formed in the resultant sintered ceramic body. It is also possible that any suitable pore forming agent or agents may be added with such binder.

Other obejcts, features and advantages of the present invention will become apparent from the ensuing description taken in conjunction with the accompanying drawings.

DESCRIPTION OF THE PREFERRED EMBODIMENTS OF THE INVENTION

Figure 1:
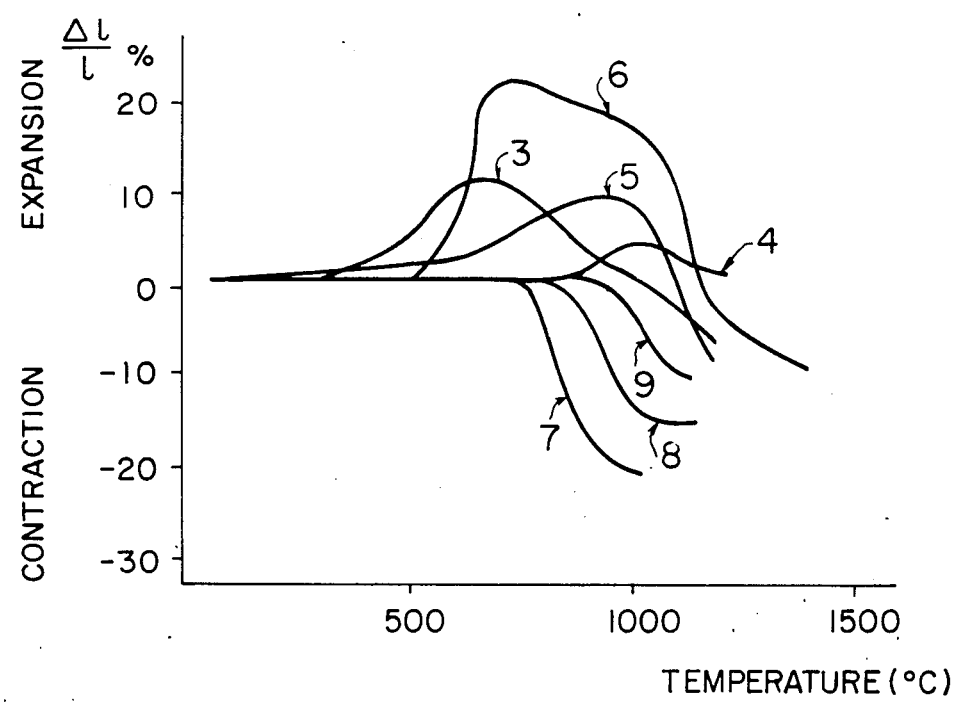
FIG. 1 shows graphs illustrating the relationships between temperature and expansion-contraction for various materials.
Figure 2A:
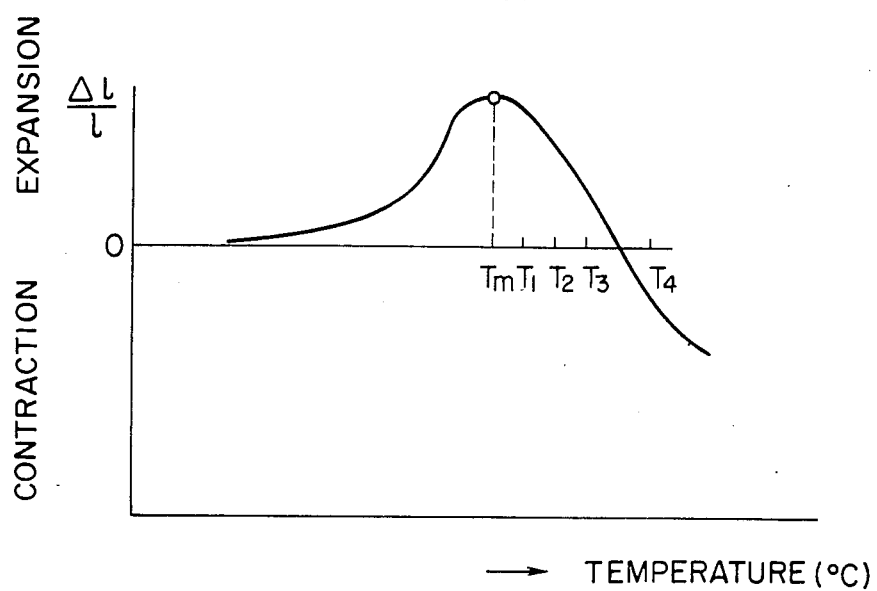
FIG. 2A illustrates the relationship between temperature and expansion-contraction useful for explaining the present invention.
Figure 2B:
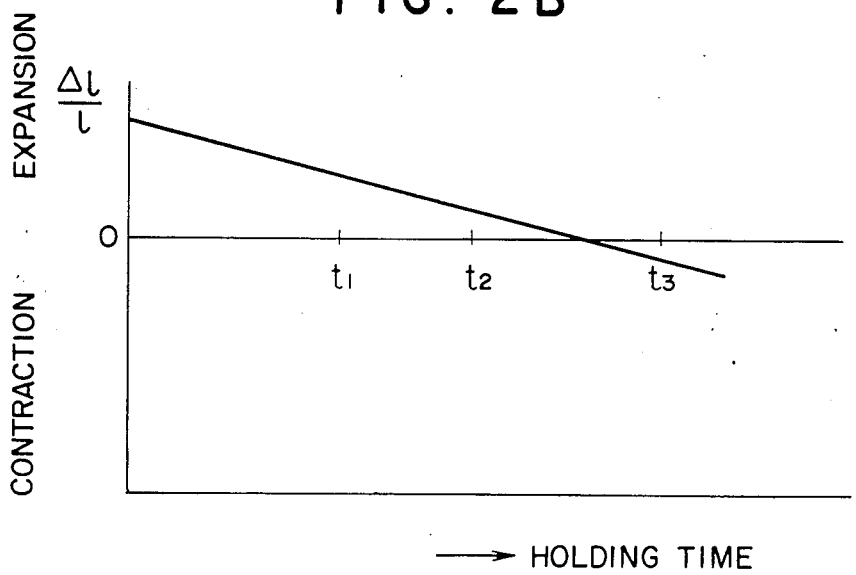
FIG. 2B illustrates the relationship between time and expansion-contraction with a predetermined temperature held, also useful for explaining the present invention.

The present invention will now be described with respect to embodiments thereof wherein use was made of lead zirconate titanate.

Example I

Lead zirconate titanate, $Pb(Zr_xTi_{1-x})O_3$ a material well known as a piezoelectric material. In this example, the following reaction was utilized to obtain such material:

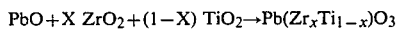

$$PbO + X\ ZrO_2 + (1-X)\ TiO_2 \rightarrow Pb(Zr_xTi_{1-x})O_3$$

In this example, the oxides PbO (indicated by A in this example), $ZrO_2$ (indicated by B in this example) and $TiO_2$ (indicated by C in this example) were employed as starting materials, and a mixture of these starting materials was subjected to expansion as the firing temperature is elevated. As the A, B and C, powdered materials having a particle size of 3 μm or less were used; paraffin in the amount of 2 weight % relative to the powdered materials was employed as binder; the resultant mixture was molded under the pressure of 500 Kg/cm$^2$; and the molded heated with temperature rise at the rate of 200° C./hour and fired at each temperature.

The extent of expansion of a ceramics body depends on the composition thereof. The final product resulting from the foregoing chemical reaction is lead titanate PbTiO$_3$ for X=0, and lead zirconate PbZrO$_3$ for X=1. For X=0 to 0.1, a maximum porosity in the range of 65 to 75% was achieved at a temperature in the range of 550° to 750° C. The firing time period subsequent to the temperature elevation was selected to be in the range of 0.1 to 5 hours, but it may be selected to be longer than 5 hours, say 10 hours or longer. It may also be selected to be shorter than 0.1 hour; in such a case, however, the fired body exhibited a poor reproducibility with respect to porosity.

Similar expansion phenomenon was observed with respect to a composition with X=0.50 to 0.56 at which peak values of piezoelectric constant (d-constant) and voltage output coefficient (g-constant) occur. For a composition with X=0.52 to 0.53, especially with X=0.52, a porosity in the range of 62 to 73% was achieved when firing was effected at a temperature in the range of 750° to 850° C., for 0.5 to 3 hours.

The same composition was fired at 1000° C., 1100° C., 1200° C., and 1300° C. or higher, for 2 hours, and in these cases, the porosities were 53%, 32%, 19%, and 10% or less, respectively. In the temperature range of 800° to 1300° C., the porosity decreases continuously and uniformly with elevation of the sintering temperature. Thus, by controlling the firing temperature, it is possible to produce PZT ceramics with a porosity controlled to a desired value.

SEM observation indicated that the pore size of a ceramics body fired at 1200° C. for 3 hours was in a uniform distribution range of 1 to 10 μm. In this way, interconnected PZT ceramics with an average pore size of about 5 μm was obtained.

As will be appreciated from the above discussion, according to this example, PZT ceramics with a porosity in the range of 73 to 10 volume % was produced without using any special pore-forming material. The porosity could also be controlled with the firing temperature. The resultant ceramics body exhibited a narrow porosity distribution band, say in the range of 1 to 10 μm. Such ceramics body can be used as filter, carrier for catalyst or the like.

Example II

Figure 3:
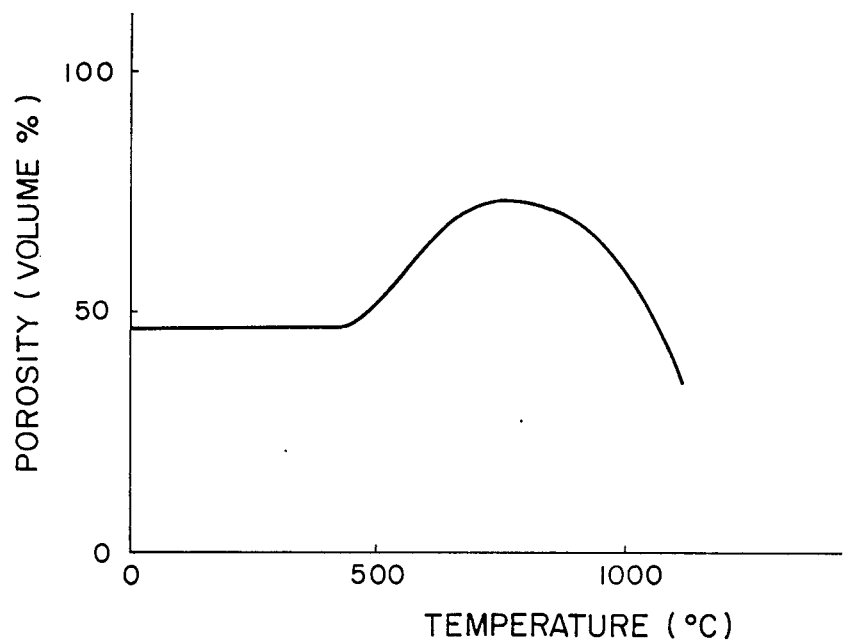
FIG. 3 shows a graph illustrating the relationship between temperature and porosity for PLZT used in the method of the present invention.

In this example, use was made of a composition (PLZT) having part of Pb in PZT substituted with La, and control similar to that in Example I was achieved as illustrated in FIG. 3 from which it will be seen a porosity in the range of about 47 to 74% has been attained over the temperature range of about 500° to 1000° C.

Example III

In this example, PbZrO$_3$ and PbTiO$_3$ were separately prepared in accordance with the following reactions:

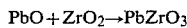

PbO + ZrO$_2$ → PbZrO$_3$

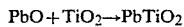

PbO + TiO$_2$ → PbTiO$_2$

Subsequently, Nb$_2$O$_5$ 0.5 weight % was added to each of the resultant compounds, i.e., PbZrO$_3$ and PbTiO$_3$ which in turn were separately fired. Thereafter, each of the fired compounds was ground into a particle size in the range of 5 to 10 μm. The resultant composition was Pb(Zr$_{0.52}$Ti$_{0.48}$)O$_3$ to which was added polyacryl system binder 1 weight % with respect to the material powder. The mixture thus obtained was molded under the pressure of 1000 Kg/cm$^2$ and fired at predetermined temperatures for 3 hours. At a temperature in the range of 1000° to 1230° C., a substantially uniform porosity in the range of 45 to 47 volume % was achieved; at a temperature of 1250° C. or higher, the fired body began to exhibit contraction; and at 1320° C., the porosity went down to 35 volume %.

When firing was effected at a temperature of 1000° C. or higher, however, the resultant PZT ceramics possessed a higher porosity than those of Example I. This effect resulted from the expansion, due to reaction, of the mixture of fired PbZrO$_3$ and PbTiO$_3$. Such effect can never be obtained by using commercially available PZT materials.

The ceramics fired at 1200° C. possessed a smaller pore size, say in the range of 2 to 5 μm; it will be appreciated that such ceramics will be useful as a material for a filter having smaller pores.

By substituting with the non-fired material part or whole of either one of PbZrO$_3$ and PbTiO$_3$ or part of both, an effect intermediate between those of Examples I and III can be produced.

Nb$_2$O$_5$ added in this example serves to facilitate polarization. The quantity of the compound to be added may be in the range of about 0.01 to 5 weight %. To attain a satisfactory result, such quantity may be in the range of 0.1 to 3 weight %. It may also be in the range of 0.2 to 2 weight %.

Substantially similar pores were formed in a body of a material having MnO$_2$ 0.1 to 2 weight % added thereto instead of Nb$_2$O$_5$.

By adding Ta$_2$O$_5$, Cr$_2$O$_3$ or Fe$_2$O$_3$ instead of Nb$_2$O$_5$ or MnO$_2$, it is possible to change the electrical properties of the resultant ceramics body.

Example IV

In this example, porous ceramics of lead zirconate titanate were prepared using PbZrO$_3$ and PbTiO$_3$ each controlled in terms of particle size.

PbZrO$_3$ and PbTiO$_3$ were separately fired at any desired temperature in the range of 650° to 1350° C. At a temperature of 650° C. or higher, firing reaction begins to occur, though partially; and at a temperature of 1350° C. or higher, volitalization of lead oxide turns out faster. In the case where PbZrO$_3$ and PbTiO$_3$ are fired in the aforementioned temperature range, the temperature and time period to be selected for subsequent firing of lead zirconate titanate depend on the temperature used for the firing of the two compounds.

Fired PbZrO$_3$ and PbTiO$_3$ were separately ground and sieved into material powder of substantially uniform particle size.

The two compounds were mixed to form Pb(Zr$_x$Ti$_{1-x}$)O$_3$; the latter was molded and fired so that the molded body was subjected to expansion, thus resulting in formation of porous Pb(Zr$_x$Ti$_{1-x}$)O$_3$ ceramics.

For X=0.4, 0.5 and 0.6, ceramics of a porosity in the range of 24 to 67 volume % were obtained.

A composition with X=0.50 to 0.56 exhibits an enhanced piezoelectric sensitivity; particularly for X=0.52 to 0.53, the wave receiving sensitivity of the piezoelectric properties is increased. Thus, porous structures with X=0.53 were prepared in this example. Substantially similar results will be obtained with a structure with X=0.52.

In this example, 5 weight % solution of PVA was added as molding binder in the quantity of 8 weight % with respect to the material powder. In this case, the bulk of the binder occupied only 0.4 weight % with respect to the material powder. The mixture was molded under a pressure of 500 Kg/cm$^2$ into a disc-like body.

Figure 4:
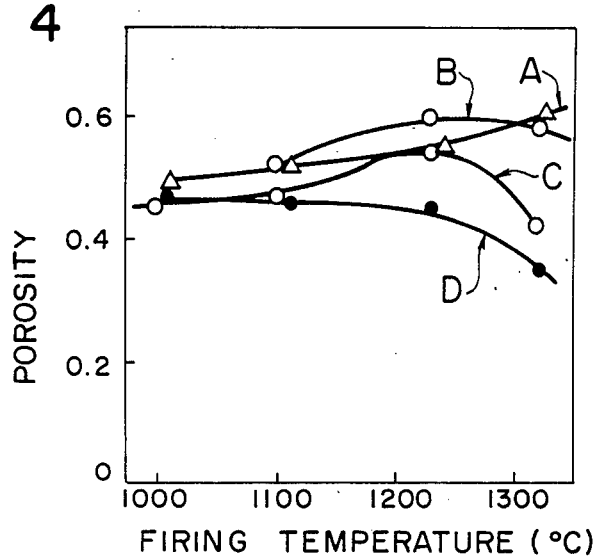
FIG. 4 is a graph showing the relationship between porosity and firing temperature of various mixtures of PZ and PT used in the method of the present invention.

FIG. 4 is a graph illustrating how the porosity of the cermics as fired varies with firing temperature when the ceramics were held at each temperature indicated on the axis of abscissa, wherein A is for a mixture of PZ 125–105 μm in particle size and PT 88–44 μm in particle size; B is for a mixture of PZ 105–74 μm in particle size and PT 88–44 μm in particle size; C is for a mixture of PZ 104 to 44 μm and PT smaller than 88 μm in particle size; and D is for a mixture of PZ smaller than 44 μm in particle size and PT 88–44 μm in particle size.

It will be seen from FIG. 4 that ceramics of a porosity as high as 40 to 65 volume % were obtained, with no pore-forming agent added thereto, according to this invention, although the relationship between the porosity and the firing time differs from one particle size to another. In this way, according to the present invention, ceramics of a desired porosity can be obtained by controlling the firing temperature and time.

Figure 5A:
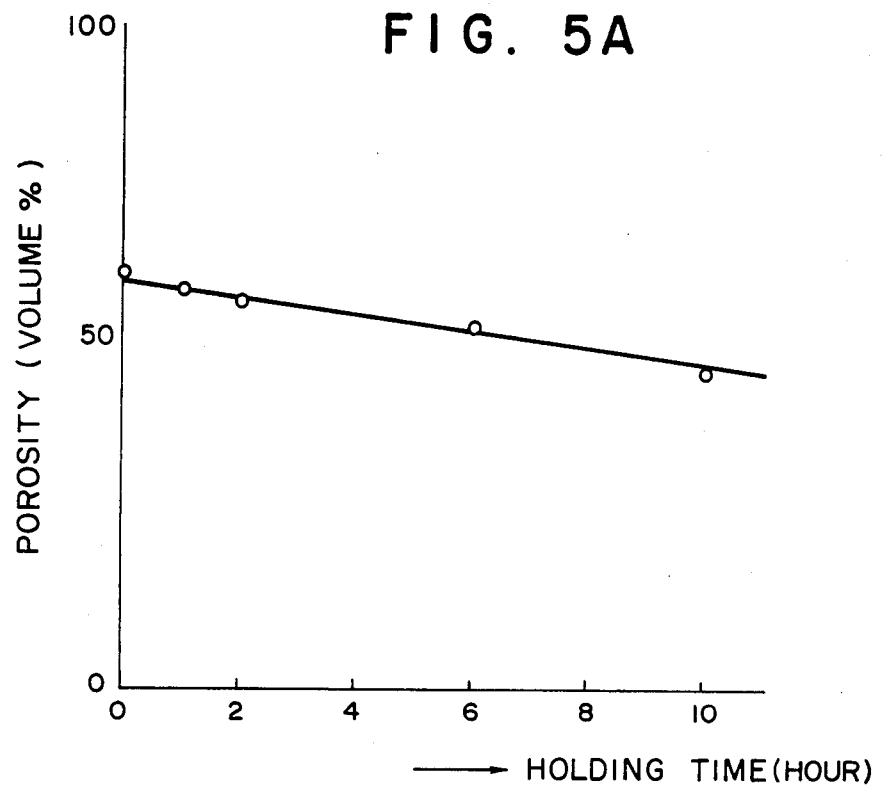
FIG. 5A is a graph showing how the porosity of a molded body consisting of PZ and PT, changes with holding time in the method of this invention.
Figure 5B:
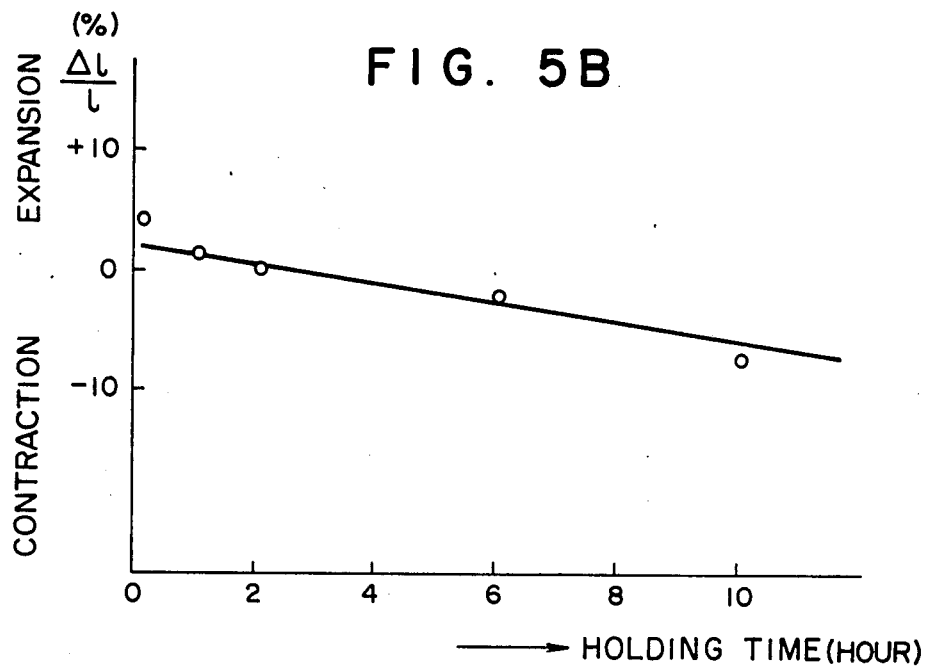
FIG. 5B is a graph indicating how the contraction and expansion change with holding time in the method of this invention.
Figure 6:
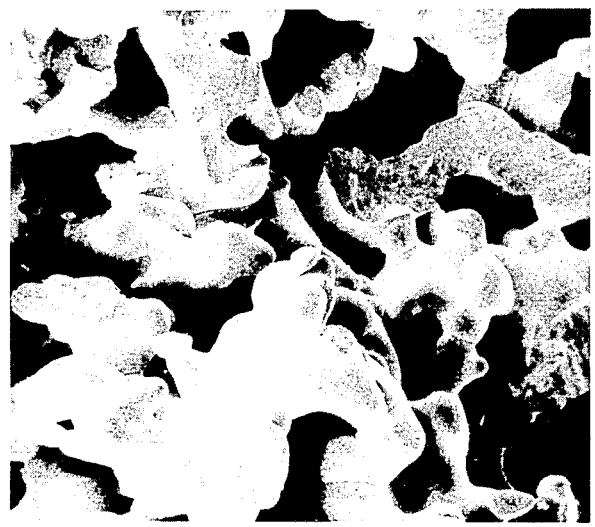
FIG. 6 is a microphotograph showing the microstructure of a porous ceramics body prepared according to the method of this invention.

FIG. 5A is a graph showing how the porosity of a molded body consisting of PbZrO$_3$ and PbTiO$_3$ each with a particle size in the range of 60 to 40 μm, varies with holding time when the molded body was heated up to 1200° and held at the temperature. From this graph, too, it will be appreciated that according to the present invention, ceramics of a desired porosity can be obtained at a predetermined temperature by controlling the time period for which the molded body is held at the temperature. FIG. 5B is a graph illustrating how contraction and expansion change with the holding time. The pore size of ceramics fired at 1200° C. for 6 hours was in the range of 10 to 30 μm, the average pore size thereof being about 20 μm. FIG. 6 is a microphotograph showing the microstructure of the porous ceramics body obtained according to this example, which is interconnected porous PZT the internal portions of which are three-dimensionally interconnected, the porosity thereof being 52%.

Figure 7:
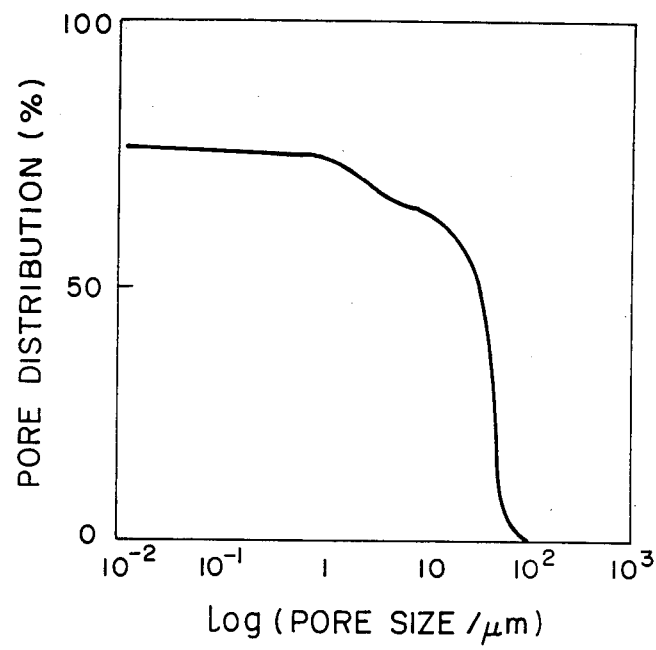
FIG. 7 is a graph showing a result obtained by measuring, means of a mercury porosimeter, the pore distribution of porous PZT prepared according to the method of this invention.

FIG. 7 is a graph showing a result obtained by measuring, by means of a mercury porosimeter, the pore distribution of porous PZT prepared by firing a mixture of PbZrO$_3$ 125–105 μm in particle size and PbTiO$_3$ 80–40 μm in particle size at 1230° C. for 3 hours. As will be seen from the measurement result shown in FIG. 4, open pores of 1/100 μm or greater occupy 75 volume % or more; above all, pores of 50–70 μm constitute the majority; and pores of 10–1 μm occupy about 10% of the whole. The result also indicates that an excellent connectivity of the pores and a narrow band of pore size distribution have been achieved.

Figure 8:
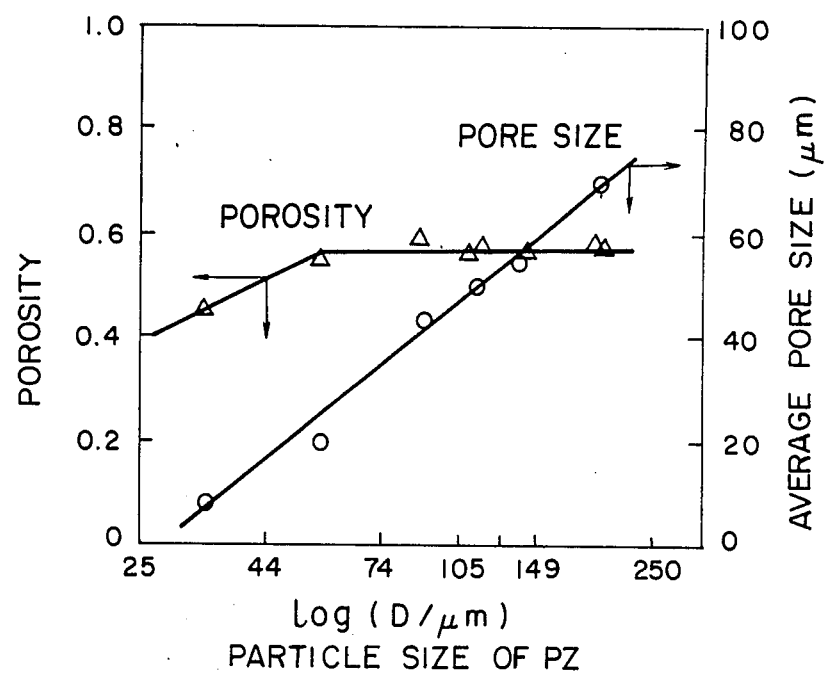
FIG. 8 is a graph indicating the relationship among the average pore size, porosity and particle size of PZ used in the method of this invention.

FIG. 8 is a graph indicating the relationship among the average pore size, porosity and particle size of PbZrO$_3$ in use. From this graph, it will be seen that the pore size depends largely on the particle size of the material powder in use.

Figure 9:
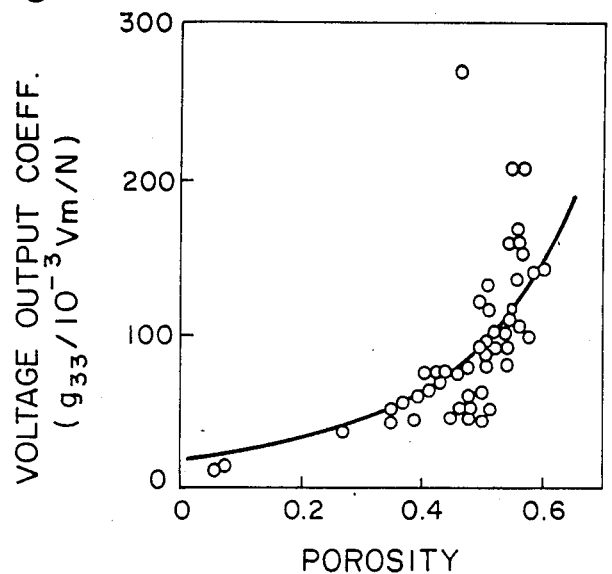
FIG. 9 is a graph showing the relationship between voltage output coefficient and porosity of PZT prepared by controlling the pore size of the material, pore size and pore structure thereof according to the method of this invention.

FIG. 9 is a graph showing the relationship between the voltage output coefficient (g$_{33}$) and the porosity of PZT ceramics prepared by controlling the particle size of the material, pore size and pore structure thereof. It will be noted from this graph that the output voltage coefficient greatly increases with increase in the porosity. Thus, it will be appreciated that the method of the present invention is highly useful. It will also be appreciated that the structure of ceramics produced by the present method is desirable for impregnation of high molecular substance, rubber or the like since the number of open pores contained therein is large.

Example V

In this example, a pore-forming material was added in the present method of producing porous ceramics by utilizing the aforementioned type of expansion phenomenon.

PbZrO$_3$ and PbTiO$_3$ were separately fired, and then ground by the use of a ball-mill into powder 10–1 μm in particle size.

In this example, too, X=0.53, i.e., the composition Pb(Zr$_{0.53}$Ti$_{0.47}$)O$_3$ was chosen for the same reason as that mentioned in Example IV.

For molding, use was made of 5 weight % solution of PVA 8 weight % with respect to the material powder.

PZT material with no pore-forming agent added thereto was fired at each of the below-indicated temperatures for 2 hours; in this case, the porosity varied in dependence on the temperature as follows: 950° C. (55 volume %), 1000° C. (53 volume %), 1200° C. (35 volume %), and 1300° C. (10 volume %).

PMM resin beads 20 weight % were added to the same mateiral, and the mixture was fired at 1000° C. for 2 hours; the porosity of the resultant body was in the range of 78–80 volume %. When the mixture was fired at 1200°, the porosity was 65 volume %. In this case, the porosity increased by 25–30 volume % as compared with that in the previous case.

Calcined PZT was ground into powder by means of ball mill; PMM resin beads 20 weight % were added thereto; and the resultant mixture was fired at 1000° C. for 2 hours. In this case, the porosity was 61 volume %, which is lower by 17–19 volume % than 78–80 volume % attained when a mixture of PbZrO$_3$ and PbTiO$_3$ alone was employed. When firing was effected at 1200° C., the porosity was 43 volume %.

As will be appreciated from the above, according to the method of the present invention wherein expansion phenomenon due to reaction, or anomalous expansion phenomenon is utilized, the quantity of a pore-forming agent to be added can be greatly reduced for the same porosity as that attained when such expansion phenomenon is not utilized. It can be seen form this example that interconnected porous structures having selected porosities in the range of 10–80 volume percent can be obtained.

Figure 10:
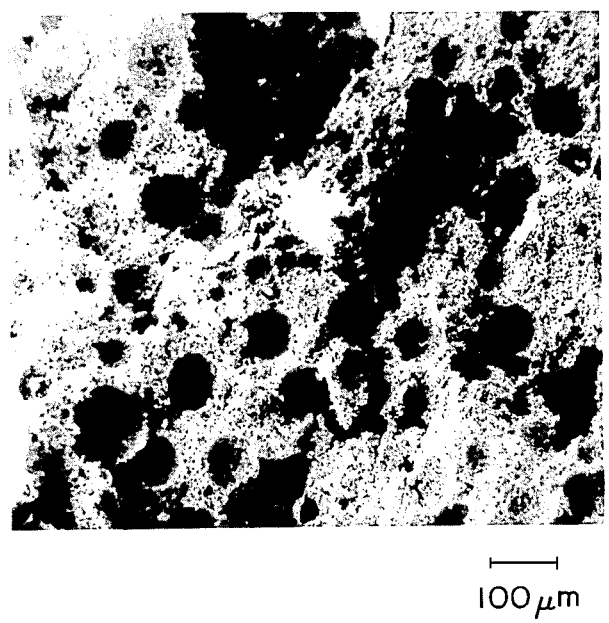
FIG. 10 is microphotograph showing a cross-section of PZT prepared according to the method of this invention.

FIG. 10 is a microphotograph showing a cross-section of the PZT ceramics produced in this example, wherein although impressions formed by the acrylic resin beads are observed, almost no crack is caused and the spherical impressions are uniformly distributed. Furthermore, it is observed that fine pores are distributed over the entire portion of the ceramics.

Example VI

In this example, one or more of the following compounds were added to a mixture of PZ and PT: PbNb$_2$O$_6$, PbTa$_2$O$_6$, BaTiO$_3$, CaTiO$_3$, PbSrO$_3$, and SrTiO₃. There were obtained results similar to those attained in the foregoing example.

Example VII

In this example, one or more of the following compounds were added to a mixture of PZ and PT: $Pb(Mg_{1/3}Nb_{2/3})O_3$, $Pb(Mn_{1/3}Nb_{2/3})O_3$, $Pb(Co_{1/3}Nb_{2/3})O_3$, $Pb(Cd_{1/2}W_{1/2})O_3$, $Sr(Y_{1/2}Nb_{1/2})O_3$, $Pb(Ni_{1/3}Nb_{2/3})$, $Pb(Zn_{1/3}Nb_{2/3})O_3$, and $Pb(Ni_{1/2}W_{1/2})O_3$. Similar results were obtained.

Example VIII

NiZn ferrite was prepared by using the following:

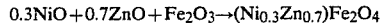

$$0.3NiO + 0.7ZnO + Fe_2O_3 \rightarrow (Ni_{0.3}Zn_{0.7})Fe_2O_4$$

A mixture of the starting materials shown by the left-hand side terms of the above expression exhibitis expansion due to the reaction (anomalous expansion) occurring during firing process. In this example, use was made of powdered NiO, ZnO and Fe₂O₃, each having a particle size of 5 to 10 μm, which were mixed together; as binder, 5 weight % of 8 weight % PVA solution was added to the resultant mixture; the mixture having the binder added thereto was molded under a presure of 1000 Kg/cm²; and then the molded body was subjected to a temperature rise of 150° C. and thereafter fired at 1150° C. for 6 hours. In this way, there was produced ceramics having an interconnected porous microstructure whith a pore size of 5 to 10 μm and porosity of 25%.

Figure 11A:
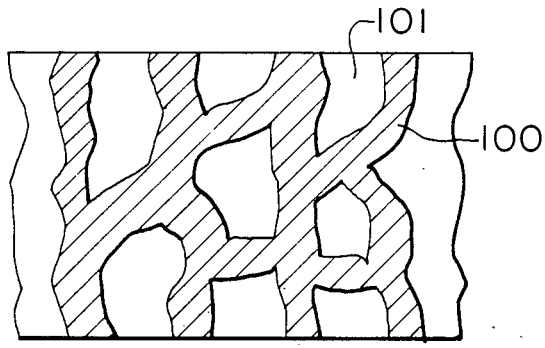
FIG. 11A is a schematic sectional view showing the microstructure of porous ceramics prepared according to the method of this invention.
Figure 11B:
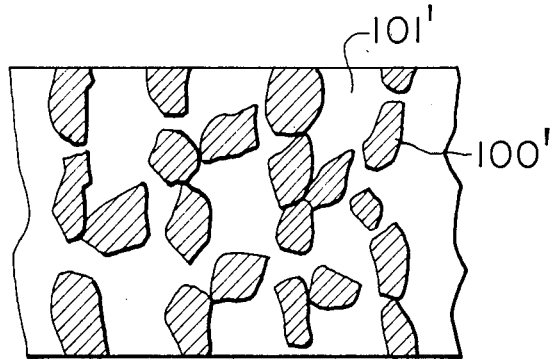
FIG. 11B is a view similar to FIG. 8A, showing the microstructure of porous ceramics prepared according to the prior art.

Referring to FIG. 11A, there is schematically shown the microstructure of ceramics prepared by using ceramics material or materials which exhibit expansion due to reaction (anomalous expansion), according to the method of the present invention, wherein reference numeral 100 indicates the interconnected porous ceramics structure, and reference 101 denotes the pores formed therein. FIG. 11B is a similar view showing the microstructure of ceramics obtained by using a system which exhibits no such expansion, wherein reference numeral 100' indicates the ceramics microstructure which is poor in connectivity, and 101' indicates the pores formed therein. It will be noted that the method of the present invention can produce porous ceramics having an improved connectivity which could never be achieved by the prior art.

As will be appreciated from the above discussion, the method of the present invention is advantageous in that it is possible to produce, on an industrial technology basis, such a porous interconnected microstructure as shown by way of example in FIG. 8A. More importantly, according to the method of the present invention, it is possible to freely control the pore size and porosity of the ceramics in the range of 1 to 100 μm and in the range of 20 to 70% respectively. That is, the method of the present invention is free from such limitations as seen in the conventional method using coral replica, referred to in the preamble portion of the present specification, wherein the pore size and porosity are limited to about 100 μm and 50% respectively. In other words, according to the method of the present invention, it is possible to control the various characteristics of ceramics as desired. As well known in the art, interconnected porous PZT ceramics has a high voltage output coefficient, i.e., high g-constant and thus finds epochal applications in the field of piezoelectric elements such as hydrophone element, underwater supersonic receiver, piezoelectric igniter, pressure sensor and so forth. The method of this invention is applicble not only in producing such PZT ceramics but also in producing other ceramics such as Ni-Zn ferrite which exhibits expansion due to reaction (anomalous expansion). In either case, the method of the present invention is capable of controlling the pore size and porosity of such ceramics as desired.

While the present invention has been described with respect to some specific embodiments thereof, it is to be understood that the invention is by no means limited thereto and encompasses all changes and modifications which will become possible within the scope of the appended claims.

I claim:

1. A method of manufacturing porous ceramic bodies comprising the steps of:
    preparing a powder from a composition of ceramic material a major portion of which is
        (a) responsive to a first temperature at which anomolous expansion occurs and in which the material forms interconnected pores, and to a second and higher temperature at which sintering occurs, and in which the material contracts in volume while maintaining the formed interconnected pores, and
        (b) in which said ceramic material is selected from the group consisting of lead zirconate titanate, lead titanate, lead zirconate, $PbTa_2O_6$, $Pb_2Fe_2O_5$, $Pb(Ta_{0.5})O_3$, $ZnFe_2O_3$, and combinations thereof.
    admixing with said powder a resinous binder, and molding said mixture into a desired shape, and,
    applying heat to said molded mixture at a temperature between that at which said anomolous expansion occurs and that at which sintering occurs, for a period of time sufficient to expand said molded mixture in volume and to form interconnected pores therein greater than those desired in the finished body, and thereafter continuing the application of heat at a temperature greater than the temperature at which sintering occurs for a sufficient period of time of contract said molded mixture in volume until a ceramic body having an interconnected porous structures of a selected porosity in the range of 10 to 80 volume percent and uniform pore distribution is obtained.

2. A method according to claim 1, including the step of selecting the particle size of said ceramic material within a range of from 0.1 to 5.0 um. to obtain the selected pore size, porosity and pore distribution of said microstructure.

3. A method according to claim 1, including the step of adding to said ceramic material powder a pore-forming substance such as a highly polymerized substance.

4. A method according to claim 1, wherein PbZrO₃ and PbTiO₃ are separately fired, then ground and mixed together to form said material powder, thereby preparing porous lead zirconate titanate.

5. A method according to claim 4, wherein one or more of Nb₂O₅, Ta₂O₅, Cr₂O₃, MnO₂ and Fe₂O₃ are added in a predetermined quantity in the range of 0.01 to 10 volume % to the mixture of PbZrO₃ and PbTiO₃, and the resultant mixture is ground to form said material powder, thereby preparing porous lead zirconate titanate.

6. A method according to claim 4, wherein said material powder is prepared by adding to the mixture of separately fired, ground and mixed $PbZrO_3$ and $PbTiO_3$, as third constituent or additive, one or more of $Cr_2O_3$, $MnO_2$, $Fe_2O_3$, $PbNb_2O_6$, $PbTa_2O_6$, $BaTiO_3$, $CaTiO_3$, $PbSrO_3$, $SrTiO_3$, $Pb(Mg_{1/3}Nb_{2/3})O_3$, $Pb(Mn_{1/3}Nb_{2/3})O_3$, $Pb(Cd_{1/2}W_{1/2})O_3$, $Pb(Sb_{1/2}Sn_{1/2})O_3$, $Pb(Y_{1/2}Nb_{1/2})O_3$, $Pb(Co_{1/3}Nb_{2/3})O_3$, $Pb(Ni_{1/3}Nb_{2/3})O_3$, $Pb(Zn_{1/3}Nb_{2/3})O_3$, $Pb(Ni_{1/2}W_{1/2})O_3$, $Pb(Co_{1/2}W_{1/2})O_3$, $Sr(Li_{2/5}W_{3/5})O_3$, thereby preparing porous lead zirconate titanate.

7. The method according to claim 1, wherein said temperature and time periods are selected to obtain a porosity substantially in the range of 20–70 volume %.

8. A method of manufacturing porous ceramic bodies comprising the steps of:

preparing a powder of ceramic material consisting of NiO, ZnO and $Fe_2O_3$, and being responsive to a first temperature at which anomolous expansion occurs and in which the material forms interconnected pores, and to a second and higher temperature at which sintering occurs, and in which the material contracts in volume while maintaining the formed interconnected pores, and admixing with said powder a resinous binder, and molding said mixture into a desired shape, and applying heat to said molded mixture at a temperature between that at which said anomolous expansion occurs and that at which sintering occurs, for a period of time sufficient to expand said molded mixture in volume and to form interconnected pores therein greater than those desired in the finished body, and thereafter continuing the application of heat at a temperature greater than the temperature at which sintering occurs for a sufficient period of time to contract said molded mixture in volume until a ceramic body having an interconnected porous structure of a selected porosity in the range of 10–80 volume percent and uniform pore distribution is obtained.

* * * * *